United States Patent [19]
Ho et al.

[11] Patent Number: 5,405,453
[45] Date of Patent: Apr. 11, 1995

[54] HIGH EFFICIENCY MULTI-JUNCTION SOLAR CELL

[75] Inventors: Frank F. Ho, Yorba Linda; Milton Y. Yeh, Santa Monica, both of Calif.

[73] Assignee: Applied Solar Energy Corporation, City of Industry, Calif.

[21] Appl. No.: 149,052

[22] Filed: Nov. 8, 1993

[51] Int. Cl.[6] .......................................... H01L 31/068
[52] U.S. Cl. .................................................. 136/249
[58] Field of Search ................................ 136/249 TJ

[56] References Cited

U.S. PATENT DOCUMENTS

| | | | |
|---|---|---|---|
| 4,255,211 | 3/1981 | Fraas | 136/249 TJ |
| 4,667,059 | 5/1987 | Olson | 136/249 |
| 4,915,744 | 4/1990 | Ho et al. | 136/262 |
| 5,223,043 | 6/1993 | Olson et al. | 136/249 TJ |

OTHER PUBLICATIONS

J. M. Olson et al, 18th IEEE Photovoltaic Specialists Conf. (1985), pp. 552–555.
J. M. Olson et al, 19th IEEE Photovoltaic Specialists Conf. (1987), pp. 285–288A.
J. M. Olson et al, 20th IEEE Photovoltaic Specialists Conf. (1988), pp. 777–780.
J. M. Olson et al, 21st IEEE Photovoltaic Specialists Conf. (1990), pp. 24–29.
J. M. Olson et al, Appl. Phys. Lett., vol. 56, No. 7, Feb. 1990, p. 623.
B. T. Cavicchi et al, Conference Record, 20th IEEE Photovoltaic Specialists Conference Sep. 1988), pp. 918–923.

Primary Examiner—Aaron Weisstuch
Attorney, Agent, or Firm—Benman Collins & Sawyer

[57] ABSTRACT

A high efficiency solar cell comprises: (a) a germanium substrate having a front surface and a back surface; (b) a back-metal contact on the back surface of the germanium substrate; (c) a first semiconductor cell comprising (1) a GaAs p-n junction formed from an n-GaAs and a p-GaAs layer, the n-GaAs layer formed on the front surface of the n-germanium substrate, and (2) a p-(Al,-Ga)As window layer, the p-(Al,Ga)As window layer formed on the p-GaAs layer; (d) a tunnel diode comprising a GaAs p+-n+ junction formed from a p+-GaAs layer and an n+-GaAs layer, the p+-GaAs layer formed on the p-(Al,Ga)As window layer; and (e) a second semiconductor cell comprising (1) a (Ga,In)P p-n junction formed from an n-(Ga,In)P layer and a p-(Ga,In)P layer, the n(Ga,In)P layer formed on the n+-GaAs layer of the tunnel diode, (2) a p-(Al,In)P window or contact layer formed on the p-(Ga,In)P layer, (3) metal grid lines contacting either the p-(Ga,In)P layer or the p-(Al,In)P layer, and (4) at least one anti-reflection coating layer covering the (Al,In)P layer. The cascade cell of the invention permits achieving actual efficiencies of over 23%.

22 Claims, 2 Drawing Sheets

HIGH EFFICIENCY MULTI-JUNCTION SOLAR CELL

ORIGIN OF THE INVENTION

The invention described herein was made in the performance of work under a contract from the United States Government, which has certain rights in this invention.

TECHNICAL FIELD

The present invention relates to germanium/gallium arsenide solar cells, and, more particularly to stacked solar cells for utilizing a large fraction of the solar spectrum.

BACKGROUND ART

Up to the present time, it has been proposed to use either germanium or gallium arsenide as the substrate for solar cells in which the principal active junction is formed of n-type and p-type gallium arsenide. Substrates of gallium arsenide have been preferred because of their electrical properties in view of the problems encountered with germanium substrates. These problems have in part involved the so-called "cascade effect", in which some of the total output arises from the junction of gallium arsenide with the germanium substrate, which is particularly responsive to infrared energy, and which has a relatively high temperature coefficient.

However, germanium would be preferred as a substrate for supporting gallium arsenide solar cells for a number of reasons. First, germanium has a greater fracture toughness than gallium arsenide, as a substrate. For example, an 8 mil (0.2 mm) thick germanium wafer is twice as strong as a 12 mil (0.3 mm) thick gallium arsenide wafer. Cost is another factor favoring germanium, since it is 40 to 50% less expensive than gallium arsenide. Finally, germanium wafers used for solar cells at 4 mils (0.1 mm) thickness are 66% lighter in weight than gallium arsenide at 12 mils (0.3 mm) thickness. Weight is an important factor for space applications, for example.

Yet, in addition to the cascade effect, germanium also evidences the so-called "self-doping" effect, which occurs at high temperatures when the germanium substrate is exposed to the gases used to deposit gallium arsenide. With germanium having a melting point of about 937° C., and with vapor deposition of gallium arsenide taking place at temperatures of up to 780° C., some germanium may be volatilized and adversely affect the critical doping of other solar cells being processed within the same enclosed chamber during production manufacturing. This effect has in the past been blocked by a special cap of gallium arsenide, involving a process which is relatively costly.

U.S. Pat. No. 4,915,744, issued Apr. 10, 1990, to Frank Ho et al and assigned to the same assignee as the present application, discloses and claims a gallium arsenide solar cell formed on a germanium substrate cut at a special angle, with its surface generally perpendicular to the [001] axis, but tilted by about 6° to 15° toward the direction generally about half-way between the [011] and [111] axial directions. To avoid the cascade effect, the junction with the substrate may be passivated or photovoltaically inhibited by initiating vapor deposition of GaAs at a temperature below 700° C. and then rapidly ramping the temperature up to a high vapor deposition temperature, then back down to normal vapor deposition temperatures. Poisoning of the GaAs layer by germanium may be prevented expensively by using a silicon dioxide coating on one side of the germanium substrate.

The foregoing patent is certainly useful for its intended purpose. However, attempts continue to develop solar cells that efficiently utilize as much of the solar spectrum as possible. For example, in order to capture as many photons from the spectrum of solar radiation as possible, the semiconductor material used in the solar cell should be designed with a small bandgap, since the semiconductor is otherwise transparent to radiation with photon energy less than the bandgap. Use of a small bandgap semiconductor material permits photons from lower energy radiation to excite electrons to jump the bandgap. However, at least two negative effects are realized in such a situation. First, the small bandgap results in a low photovoltage device, with low power output. Second, the photons from higher energy radiation will produce many hot carriers with much excess energy that will be lost as heat upon almost immediate thermalization of these hot carriers to the edge of the conduction band.

Yet, on the other hand, if the solar cell is constructed with a larger bandgap to increase the photovoltage and reduce energy loss by thermalization of hot carriers, then the photons from lower energy radiation will not be absorbed, and thus the radiation from the solar spectrum will not be fully utilized.

A solution to the foregoing problem is disclosed and claimed in U.S. Pat. No. 4,667,059, issued May 19, 1987, to Jerry Olson. Essentially, a multijunction (cascade) tandem photovoltaic solar cell device comprises a $Ga_x In_{1-x}P$ (where $0.505 \leq x \leq 0.515$) top cell semiconductor lattice-matched to a GaAs bottom cell semiconductor at a low resistance heterojunction, preferably a p+/n+ heterojunction between the cells. The top and bottom cells are both lattice-matched and current matched for high efficiency solar radiation conversion to electrical energy.

However, the drawback to using a p+/n+ heterojunction between the cells is as follows: It is more difficult to achieve good p+/n+ tunnel diode characteristics (i.e., low tunnel resistance value with high peak tunnel-current density) when the bandgap value of the semiconductor is high. The GaInP layer has bandgap value up to more than 1.9 eV when heavily doped (a necessary requirement for a good tunnel diode), which is much higher than the bandgap of GaAs. Hence, a GaInP/GaAs tunnel diode will not be able to achieve as high a peak tunnel-current density as a GaAs/GaAs tunnel diode. This will reduce the energy conversion efficiency of the cascade solar cell, especially for cells with high current density (i.e., concentrator cells).

Consequently, investigations continue to develop high efficiency solar cells.

DISCLOSURE OF INVENTION

In accordance with the invention, a high efficiency solar cell is provided, comprising:

(a) a germanium substrate having a front surface and a back surface;

(b) a back-metal contact on the back surface of the germanium substrate;

(c) a first semiconductor cell comprising (1) a GaAs p-n junction formed from an n-GaAs and a p-GaAs layer, the n-GaAs layer formed on the front surface of the germanium substrate, and (2) a p-(Al,Ga)As window layer, the p-(Al,Ga)As window layer formed on the p-GaAs layer;

(d) a tunnel diode comprising a GaAs p+-n+ junction formed from a p+-GaAs layer and an n+-GaAs layer, the p+-GaAs layer formed on the p-(Al,Ga)As contact layer;

(e) a second semiconductor cell comprising (1) a (Ga,In)P p-n junction formed from an n-(Ga,In)P layer and a p-(Ga,In)P layer, the n-(Ga,In)P layer formed on the n+-GaAs layer of the tunnel diode, (2) a p-(Al,In)P window or contact layer formed on the p-(Ga,In)P layer, (3) metal grid lines contacting the p-(Al,In)P layer and, optionally the p-(Ga,In)P layer, and (4) at least one anti-reflection coating layer covering the p-(Al,In)P layer.

The cascade cell of the invention permits achieving actual efficiencies of over 23%.

BEST MODES FOR CARRYING OUT THE INVENTION

In earth orbit, outside of the atmosphere, radiation from the sun (air mass zero; AM0) is at an intensity of about 135.3 mW/cm$^2$. Photovoltaic solar cells convert this incident radiation into electrical power, and the operating efficiency of solar cells is in the range of about 12 to 18%, where the operating efficiency is defined as the ratio of the electrical output power to the solar radiation incident on the solar cell. (The operating efficiency is to be distinguished from the theoretical efficiency, which is usually much higher, but difficult to attain, for a variety of reasons. Efforts are underway to bring the operating efficiency as close to the theoretical efficiency as possible. It is to these efforts that the present invention is directed.)

In addition to high efficiency, other factors which are desirable for solar cells include high mechanical strength, low temperature coefficient (of output power with changes in temperature), and good resistance to reverse bias conditions.

Figure 1:
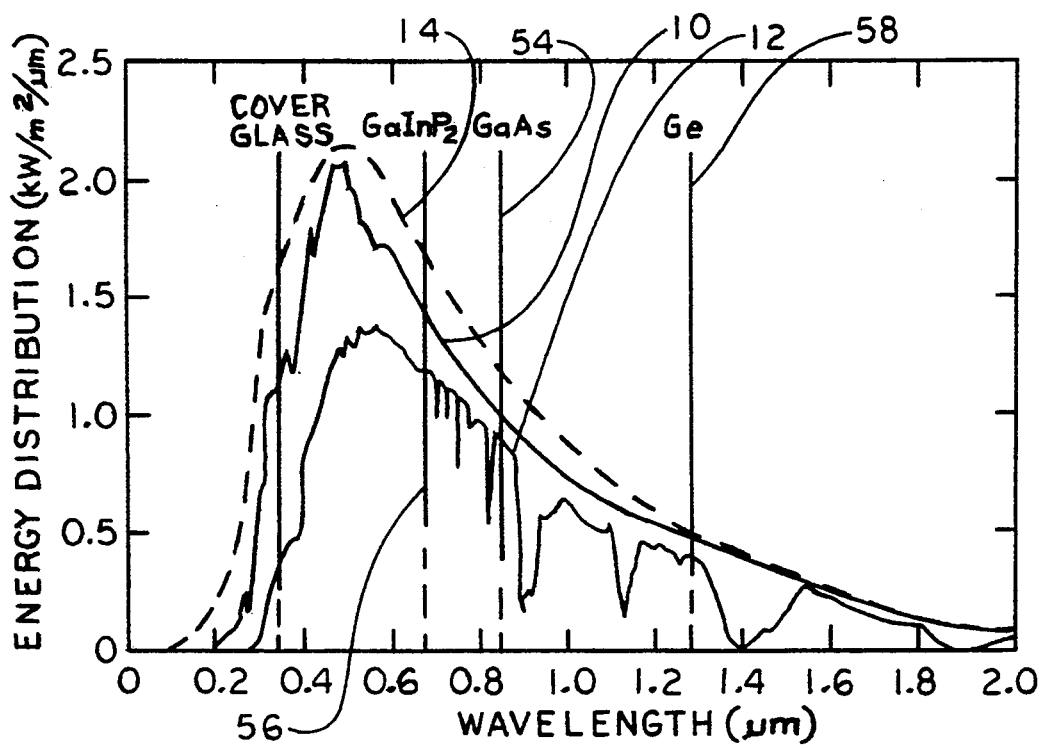
FIG. 1, on coordinates of energy distribution in kW/m$^2$/μm and wavelength in μm, is a plot of the spectral distribution of sunlight (AM0, AM1.5) and of radiation from a blackbody at 6,000K, showing the direct bandgap absorption edges for GaInP$_2$, GaAs, and Ge.

Referring now to the drawings, wherein like numerals of reference indicate like elements throughout, a spectral distribution of sunlight is shown in FIG. 1. Curve 10 depicts AM0, while Curve 12 depicts AM1.5 (terrestrial sun). For comparison, Curve 14 depicts radiation from a blackbody at 6,000K. It is desired to utilize as much of the radiation from the solar spectrum as possible.

Figure 2:
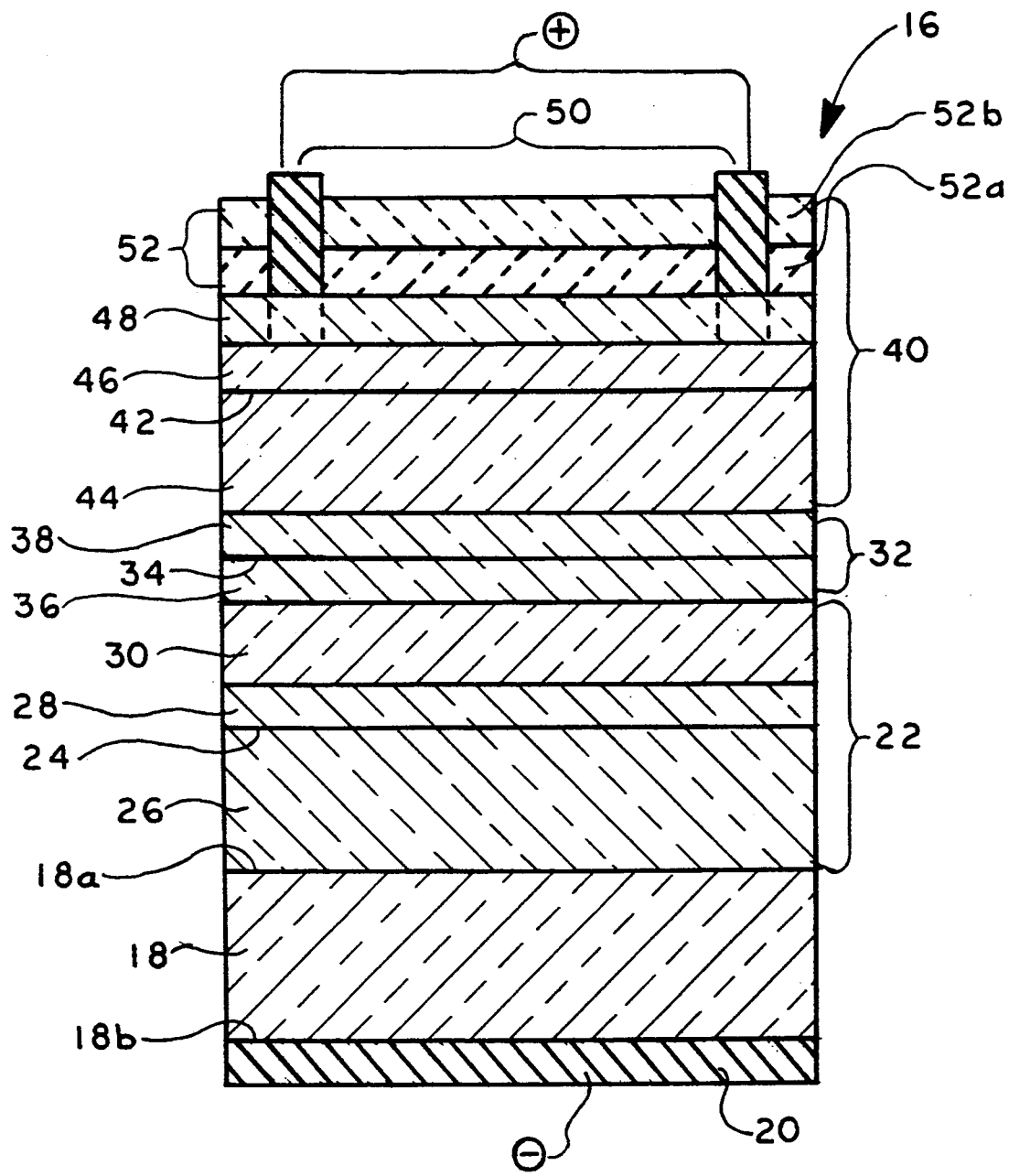
FIG. 2 is a cross-sectional view of a cascade solar cell structure in accordance with the present invention.

In accordance with the invention, and referring now to FIG. 2, a high efficiency solar cell 16 is provided, comprising:

(a) a germanium substrate 18 having a front surface 18a and a back surface 18b;

(b) a back-metal contact 20 on the back surface of the germanium substrate;

(c) a first semiconductor cell 22 comprising (1) a GaAs p-n junction 24 formed from an n-GaAs layer 26 and a p-GaAs layer 28, the n-GaAs layer formed on the front surface of the n-germanium substrate, and (2) a p-(Al,Ga)As window layer 30, the p-(Al,Ga)As window layer formed on the p-GaAs layer;

(d) a tunnel diode 32 comprising a GaAs p+-n+ junction 34 formed from a p+-GaAs layer 36 and an n+-GaAs layer 38, the p+-GaAs layer formed on the p-(Al,Ga)As contact layer;

(e) a second semiconductor cell 40 comprising (1) a (Ga,In)P p-n junction 42 formed from an n-(Ga,In)P layer 44 and a p-(Ga,In)P layer 46, the n-(Ga,In)P layer formed on the n+-GaAs layer of the tunnel diode, (2) a p-(Al,In)P window or contact layer 48 formed on the p-(Ga,In)P layer, (3) metal grid lines 50 contacting the p-(Al,In)P layer, and, optionally, the p-(Ga,In)P layer, and (4) at least one anti-reflection coating layer 52 covering the p-(Al,In)P layer.

The germanium substrate 18 is processed in accordance with the teachings of U.S. Pat. No. 4,915,744, cited above, which teachings are incorporated herein by reference. Briefly, the germanium substrate 18 has an angle of orientation tilted away from the [001] direction at an acute angle approximately half-way between the [011] and the [111] directions.

The germanium substrate 18 is provided with the appropriate dopant, such as antimony or arsenic, to render it of n-type conductivity. Antimony is preferably employed in the practice of the invention. Such doping of the Ge substrate is conventional in the prior art. The thickness of the Ge substrate 18 is about 200 μm (0.2 mm) or thinner, and it has a resistivity of less than 0.4 ohm-cm.

In one embodiment of the present invention, called herein the "inactive Ge junction", the front surface 18a of the substrate 18 is treated so as to inhibit or passivate the photovoltaic effect at the junction between the substrate 18 and the n-GaAs layer 26. As disclosed in U.S. Pat. No. 4,915,744, cited above, this is done by initially depositing the GaAs layer at a temperature starting well below 700° C., and specifically starting at about 660° C. and quickly ramping up to 748° C., then cooling down to below 680° C. where the complete GaAs layer 26 is formed. Improved morphology of the interface 18a is obtained by the quick ramping up to the deposition temperature of 748° C. As is well-known, deposition of GaAs is typically accomplished using trimethyl gallium, or (CH$_3$)$_3$Ga, and arsine, or AsH$_3$, in a hydrogen carrier in a metal organic chemical vapor deposition (MOCVD) process.

In this first embodiment, the solar cell 16 utilizes that portion of the solar spectrum received by the first cell 22 and by the second cell 40. FIG. 1 shows the portion of the solar spectrum captured, via the direct bandgap absorption edge for GaAs 54 and the direct absorption edge for GaInP$_2$ 56. Specifically, the second cell 40 absorbs photons in the wavelength range of about 0.38 to 0.67 μm, while the first cell 22 absorbs photons in the wavelength range of about 0.67 to 0.87, to which the second cell is transparent, plus residual photons (small amount) transmitted through the top cell in the range of about 0.38 to 0.67 μm.

A region indicated as "cover glass" is denoted in FIG. 1. This is an attachment to a solar cell to protect against UV degradation of a silicone-based adhesive and to provide some radiation protection. The cover glass does not form a part of the present invention.

In another embodiment of the present invention, called herein the "active Ge junction", the front surface 18a is not specially treated as described above for the inactive Ge junction, and the solar cell 16 utilizes the additional portion of the solar spectrum received by the Ge substrate 18, primarily via the direct bandgap absorption edge for Ge 58. Thus, in addition to the photons absorbed in the wavelength range as described above, the active Ge junction device permits absorption in the wavelength range of about 0.87 to 1.29 μm due to the direct band gap of Ge, plus weak absorption in the wavelength range of about 1.29 to 1.88 μm due to the indirect band gap of Ge.

In the formation of the active Ge junction, GaAs growth is initiated at the desired temperature of about 748° C. (about the highest temperature used in the inactive Ge junction device). Also, while the same type of substrate crystallographic orientation described above is employed in both cases (inactive and active Ge junction), in the active case, the requirement that the angle of orientation be tilted away from the [001] direction at an acute angle of approximately half-way between the [011] and the [111] directions is not as critical as it is in the inactive case. Consequently, while the angle of orientation is still tilted away from the [001] direction, it need not be approximately half-way between the other two directions.

The following description is presented with regard to both the inactive Ge junction device and the active Ge junction device. At the end of the description, further active Ge junction device considerations are given.

The majority of the n-GaAs layer 26 is formed under the growth conditions specified above to a thickness of about 3 to 10 μm, and preferably about 10 μm, and is doped with an n-type conductivity dopant, such as selenium, sulfur, or tellurium, to a concentration of about 0.5 to $2 \times 10^{17}$ cm$^{-3}$. The initial layer adjacent the Ge substrate can be heavily doped to greater than $2 \times 10^{18}$ cm$^{-3}$. Doping during growth of this layer is conventional and forms no part of this invention.

The p-GaAs layer 28 is conventionally grown by MOCVD to a thickness of about 0.2 to 2 μm, and preferably about 0.45 μm, and is doped with a p-type conductivity dopant, such as zinc, cadmium, magnesium, and carbon, to a concentration of about 1 to $2 \times 10^{18}$ cm$^{-3}$. The particular thickness depends on the specific application.

The p-(Al,Ga)As window layer 30 is conventionally grown by MOCVD to a thickness of about 0.05 to 2 μm, preferably about 0.4 to 0.7 μm, and is doped with a p-type conductivity dopant, again, zinc, cadmium, magnesium, or carbon, to a concentration of $\geq 1$ to $2 \times 10^{18}$ cm$^{-3}$. The source of aluminum is advantageously trimethyl aluminum.

Preferably, the composition of this window layer 30 comprises p-Al$_{1-x}$Ga$_x$As, where x ranges from about 0.2 to 0.8. The p-(Al,Ga)As layer is transparent to light penetrating the second cell 40 and thus serves as a window for the first cell 22 while passivating the underlying p-GaAs layer 28. The amount of aluminum is constrained to 0.8 mole fraction or less, since it is difficult to achieve good epitaxial growth. Preferably, the value of x is about 0.5. Omission of this layer would result in a lower short circuit current, I$_{sc}$.

The p$^+$-GaAs layer 36 (the first tunnel diode layer) is conventionally grown by MOCVD to a thickness of about 0.01 to 0.02 μm, and preferably about 0.012 μm, and is heavily doped with a p-type conductivity dopant, such as carbon, zinc, magnesium, or cadmium, to a concentration in excess of $5 \times 10^{18}$ cm$^{-3}$.

The n$^+$-GaAs layer 38 (the second tunnel diode layer) is also conventionally grown by MOCVD to a thickness of about 0.01 to 0.02 μm, and preferably about 0.012 μm, and is heavily doped with an n-type conductivity dopant, such as selenium, sulfur, or tellurium, to a concentration in excess of $5 \times 10^{18}$ cm$^{-3}$.

The function of the tunnel diode 32 is to change polarity between the two cells 22, 40 and to interconnect them together without forming a junction. Due to the degenerate doping, carriers move by tunneling, which provides the low resistance interconnect, when current density is below the peak tunnel-current density value.

The n-(Ga,In)P layer 44 is conventionally grown by MOCVD to a thickness of about 0.2 to 0.5 μm, and preferably about 0.35 μm, and is doped with an n-type conductivity dopant, such as selenium, sulfur, or tellurium, to a concentration of about 1 to $4 \times 10^{17}$ cm$^{-3}$. The source of phosphorus is phosphine (PH$_3$) or tertiary-butylphosphine. Preferably, the composition of this layer is Ga$_{0.49}$In$_{0.51}$P, in order to be well-lattice matched to the underlying GaAs layer 38, and for convenience is referred to herein as n-GaInP$_2$.

The p-(Ga,In)P layer 46 is conventionally grown by MOCVD to a thickness of about 0.1 to 0.5 μm, and preferably about 0.2 μm, and is doped with a p-type conductivity dopant, such as zinc, cadmium, or magnesium, to a concentration of about 1 to $2 \times 10^{18}$ cm$^{-3}$. Preferably, the composition of this layer is also the 49/51 composition given above, and again is simply referred to herein as p-GaInP$_2$.

The p-(Al,In)P window or contact layer 48 is conventionally grown by MOCVD to a thickness of about 0.02 to 0.07 μm, and preferably about 0.025 μm, and is doped with a p-type conductivity dopant, such as zinc, cadmium, or magnesium. The source of indium is trimethyl indium or ethyl dimethyl indium. The concentration of the dopant is not critical, so long as the semiconductor is p-doped in order to provide a window or contact to the underlying p-GaInP$_2$ layer 46. Preferably, the ratio of Al to In is 55:45, and thus the composition may be conveniently represented as p-AlInP$_2$. The function of this layer 48 is to passivate the underlying p-GaInP$_2$ layer 46. In this capacity, it functions as a window. Alternatively, it may be employed as a contact layer, as described more fully below in connection with the metal grid contact 50.

The growth of the semiconductor layers is similar to that described earlier for GaAs, and employs conventional MOCVD processes. The growth of all layers starting with the p-GaAs layer 28 through the p-AlInP$_2$ contact layer 48 is conveniently carried out at a temperature of about 650° C., but for the growth of the p$^+$-GaAs tunnel diode layer 36, which is grown at a temperature of about 620° C.

Metal is deposited and patterned to form metal grid lines 50 that contact the p-AlInP$_2$ contact layer 48. In this embodiment, the p-AlInP$_2$ layer 48 serves as a contact to the underlying GaInP$_2$ layer 46. The metal contact 50 is formed into a grid pattern in order to permit solar radiation (not shown) to enter into the device 16 first through the second cell 40, and then subsequently into the first cell 22, and finally into the Ge substrate 18. The second and first cells 40, 22, respectively, generate a photocurrent in any event. The Ge substrate 18 generates a photocurrent in the event the second embodiment is employed.

Alternatively, the metal grid 50 may be formed directly on the p-GaInP$_2$ layer 46, making direct electrical contact thereto. In that case, the p-AlInP$_2$ layer 48 functions as a window, allowing solar radiation to pass through to the GaInP$_2$ layers 44, 46.

As is conventional, the metal grid 50 has a thickness ranging from about 2 to 10 μm and a line width ranging from about 4 to 30 μm, with spacing between grids of about 200 to 2,000 μm (center-to-center). The deposition and patterning of the metal grid 50 is conventional and forms no part of this invention.

Finally, at least one anti-reflection layer 52 is formed on the p-AlInP$_2$ layer 48. Preferably, a two-component anti-reflection layer, comprising a titanium oxide (TiO$_x$) layer 52a, where x ranges from about 1 to 2, and an aluminum oxide (Al$_2$O$_y$) layer 52b, where y ranges from about 2 to 3, is employed. The thickness of the TiO$_x$ layer is about 0.04 to 0.06 μm, and preferably about 0.05 μm, and the thickness of the Al$_2$O$_y$ layer is about 0.05 to 0.09 μm, and preferably about 0.07 μm.

While Olson, U.S. Pat. No. 4,667,059 (cited above), prefers employing a p-doped substrate, Applicants have found that only an n-doped substrate will permit proper functioning of their inactive germanium junction device. Specifically, use of a p-germanium substrate would result in diffusion of As into the substrate during deposition of GaAs, which would form a p-n junction within the germanium substrate, since As is an n-dopant in germanium. Use of an n-type substrate avoids this problem, since any diffusion of As into n-type germanium would not form the p-n junction.

Figure 3:
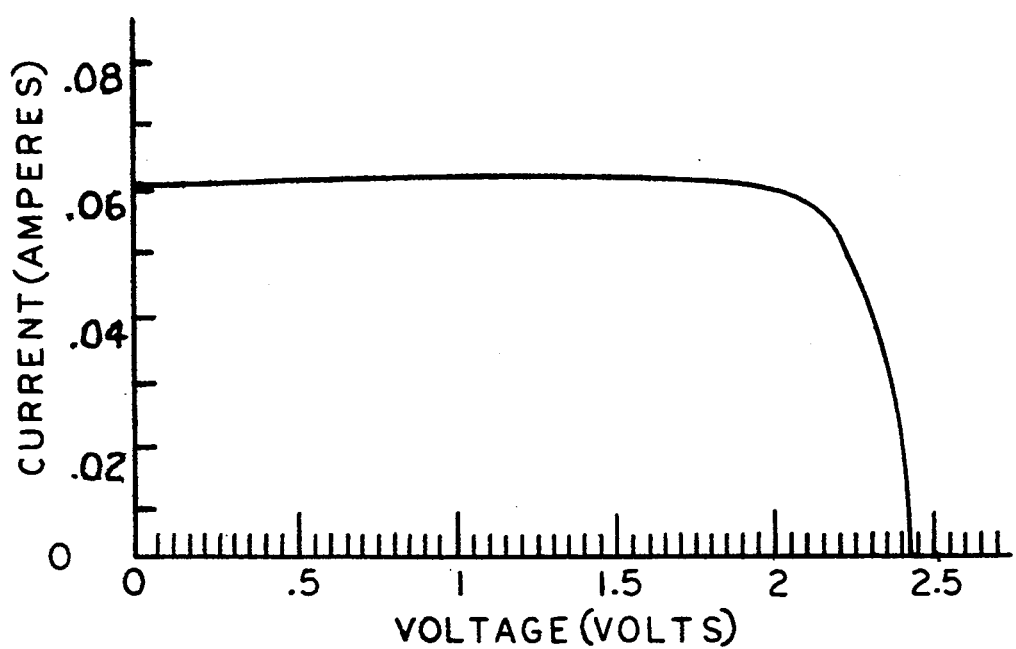
FIG. 3, on coordinates of current in Amperes and voltage in Volts, is a plot of a light I-V curve for a GaInP$_2$/GaAs cascade solar cell made on a Ge substrate, in accordance with one embodiment of the present invention.

In the first embodiment described earlier (inactive germanium junction), the device is intended for space applications, and is expected to operate at an efficiency of about 23% (at AM0, 28° C.). In support of this expectation, FIG. 3 shows an I-V plot of a device 16 fabricated as described above. The value of I$_{sc}$ (short circuit current) was 60.6 mA and the value of V$_{oc}$ (open circuit voltage) was 2,425 mV. The curve fill factor was 84.7% and the efficiency was determined to be 23%. Additional measured parameters included the P$_m$ (maximum power) of 124 mW, V$_m$ (the voltage at the maximum power point) of 2,140 mV, and I$_m$ (the current at the maximum power point) of 58.2 mA.

In the second embodiment described earlier (active germanium junction), the device is intended for terrestrial applications, and is expected to operate at an efficiency of about 25% (at AM0, 28° C.). The active junction was not used in previous germanium-based devices, such as disclosed in Ho, U.S. Pat. No. 4,915,744 (cited earlier), due to the requirement that a good junction be formed to the Ge surface 18a. This in turn requires good internal properties to obtain a good current; that is, the current generated must be equal to or greater than that generated in the top cell 40. If the current generated is less, then the efficiency of the device 16 is reduced. In the device disclosed in the Ho et al patent, the top cell was what is essentially the bottom cell 22 in the present device 16. Ho et al teach an improved method for epitaxial growth of the n-GaAs layer 26, by the use of substrate orientation and growth temperature, as described above. This improved method in turn influences the p-n junction properties. Further, by adding the second cell 40 to the device, this relaxes the current requirement by a factor of two, and thus the current relationships between the Ge substrate 18 and the top cell 40 generated in the cascade device 16 of the invention are not as critical as in the case of a single cell, such as disclosed in the Ho et al patent.

In the case of the active Ge junction device, or three-junction device, either an n-Ge or a p-Ge substrate 18 may be employed. The earlier discussion was presented in terms of an n-Ge substrate 18. In the case of the p-Ge substrate 18, the polarities of the subsequent layers are reversed. Thus, the device comprises, in sequence, a p-GaAs layer 26, an n-GaAs layer 28, an n-(Al,Ga)As window layer 30, an n$^+$-GaAs layer 36, a p$^+$-GaAs layer 38, a p-(Ga,In)P layer 44, an n-(Ga,In)P layer 46, an n-(Al,In)P window or contact layer 48, metal grid lines 50, and anti-reflection layer(s) 52. An additional tunnel diode (not shown) may be utilized between the germanium, or bottom, cell 18 and the first cell 22 to change polarity from the germanium cell to the first cell. The thickness and compositions are the same as given for the inactive Ge device, or two-junction device, above. The dopants are appropriately changed to provide the requisite doping, using the dopants listed. The polarity of the cell is also reversed, as shown in phantom in FIG. 2.

INDUSTRIAL APPLICABILITY

The solar cell of the invention is expected to find use in both space and terrestrial applications.

Thus, there has been disclosed a high efficiency solar cell comprising a cascade cell formed on a germanium substrate. It will be readily apparent to those skilled in this art that various changes and modifications of an obvious nature may be made, and all such changes and modifications are considered to fall within the scope of the invention as defined by the appended claims.

What is claimed is:

1. A high efficiency solar cell comprising:
   (a) an n-germanium substrate having a front surface and a back surface;
   (b) a back-metal contact on said back surface of said germanium substrate;
   (c) a first semiconductor cell comprising (1) a GaAs p-n junction formed from an n-GaAs and a p-GaAs layer, said n-GaAs layer formed on said front surface of said n-germanium substrate, and (2) a p-(Al,Ga)As window layer, said p-(Al,Ga)As window layer formed on said p-GaAs layer;
   (d) a tunnel diode comprising a GaAs p$^+$-n$^+$ junction formed from a p$^+$-GaAs layer and an n$^+$-GaAs layer, said p$^+$-GaAs layer formed on said p-(Al,-Ga)As contact layer;
   (e) a second semiconductor cell comprising (1) a (Ga,In)P p-n junction formed from an n-(Ga,In)P layer and a p-(Ga,In)P layer, said n-(Ga,In)P layer formed on said n$^+$-GaAs layer of said tunnel diode and said p-(Ga,In)P layer formed on said n-(Ga,In)P layer, (2) a p-(Al,In)P layer formed on said p-(Ga,In)P layer, (3) metal grid lines contacting said p-(Al,In)P layer, and (4) at least one anti-reflection coating layer covering said p-(Al,In)P layer.

2. The solar cell of claim 1 wherein said at least one anti-reflection coating comprises a first layer of a titanium oxide formed on said p-(Al,In)P layer and a second layer of an aluminum oxide formed on said titanium oxide layer.

3. The solar cell of claim 2 wherein said titanium oxide is represented by the formula TiO$_x$, where x ranges from about 1 to 2 and wherein said aluminum oxide is represented by the formula $Al_2O_y$, where y ranges from about 2 to 3.

4. The solar cell of claim 2 wherein said titanium oxide layer ranges from about 0.04 to 0.06 μm in thickness and wherein said aluminum oxide layer ranges from about 0.05 to 0.09 μm in thickness.

5. The solar cell of claim 4 wherein said titanium oxide layer is about 0.05 μm thick and wherein said aluminum oxide layer is about 0.07 μm thick.

6. The solar cell of claim 1 wherein said front surface of said germanium substrate is passivated so that said solar cell generates a photovoltage from said first and second cells to form a two-junction device.

7. The solar cell of claim 1 wherein said solar cell generates a photovoltage from said germanium substrate and said first and second cells to form a three-junction device.

8. The solar cell of claim 1 wherein said metal grid lines additionally contact said p-(Ga,In)P layer.

9. The solar cell of claim 1 wherein:
   (a) said n-germanium substrate is doped with antimony or arsenic and has a resistivity of less than 0.4 ohm-cm;
   (b) said n-GaAs layer has a thickness ranging from about 3 to 10 μm and is doped with an n-type dopant selected from the group consisting of selenium, sulfur, and tellurium to a concentration of about 0.5 to $2 \times 10^{17}$ cm$^{-3}$;
   (c) said p-GaAs layer has a thickness ranging from about 0.2 to 2 μm and is doped with a p-type dopant selected from the group consisting of zinc, cadmium, magnesium, and carbon to a concentration of about 1 to $2 \times 10^{18}$ cm$^{-3}$;
   (d) said p-(Al,Ga)As window layer has a thickness ranging from about 0.05 to 2 μm and is doped with a p-type dopant selected from the group consisting of zinc, cadmium, magnesium, and carbon to a concentration of $\geq 1$ to $2 \times 10^{18}$ cm$^{-3}$, said p-(Al,Ga)As layer comprising p-$Al_{1-x}Ga_xAs$, where x ranges from 0.2 to 0.8;
   (e) said p+-GaAs layer has a thickness ranging from about 0.01 to 0.02 μm and is doped with a p-type dopant selected from the group consisting of carbon, zinc, magnesium, and cadmium to a concentration greater than $5 \times 10^{18}$ cm$^{-3}$;
   (f) said n+-GaAs layer has a thickness ranging from about 0.01 to 0.02 μm and is doped with an n-type dopant selected from the group consisting of selenium, sulfur, and tellurium to a concentration greater than $5 \times 10^{18}$ cm$^{-3}$;
   (g) said n-(Ga,In)P layer has a thickness ranging from about 0.2 to 0.5 μm and is doped with an n-type dopant selected from the group consisting of selenium, sulfur, and tellurium to a concentration of about 1 to $4 \times 10^{17}$ cm$^{-3}$, said n-(Ga,In)P layer comprising n-$Ga_{0.49}In_{0.51}P$;
   (h) said p-(Ga,In)P layer has a thickness ranging from about 0.1 to 0.5 μm and is doped with a p-type dopant selected from the group consisting of zinc, cadmium, and magnesium to a concentration of about 1 to $2 \times 10^{18}$ cm$^{-3}$, said p-(Ga,In)P layer comprising p-$Ga_{0.49}In_{0.51}P$; and
   (i) said p-(Al,In)P layer has a thickness ranging from about 0.02 to 0.07 μm and is doped with a p-type dopant selected from the group consisting of zinc, cadmium, and magnesium, said p-(Al,In)P layer comprising p-$Al_{0.55}In_{0.45}P$.

10. The solar cell of claim 9 wherein:
   (a) said n-germanium substrate is doped with antimony;
   (b) said n-GaAs layer has a thickness of about 10 μm and is doped with selenium;
   (c) said p-GaAs layer has a thickness of about 0.45 μm and is doped with zinc;
   (d) said p-(Al,Ga)As window layer has a thickness ranging from about 0.4 to 0.7 μm and is doped with zinc, where x is about 0.5;
   (e) said p+-GaAs layer has a thickness of about 0.012 μm and is doped with carbon;
   (f) said n+-GaAs layer has a thickness of about 0.012 μm and is doped with selenium;
   (g) said n-(Ga,In)P layer has a thickness of about 0.35 μm and is doped with selenium;
   (h) said p-(Ga,In)P layer has a thickness of about 0.2 μm and is doped with zinc; and
   (i) said p-(Al,In)P layer has a thickness of about 0.025 μm and is doped with zinc.

11. A high efficiency three-junction solar cell comprising:
   (a) a bottom semiconductor cell comprising a p-germanium substrate having a front surface and a back surface;
   (b) a back-metal contact on said back surface of said germanium substrate;
   (c) a first semiconductor cell comprising (1) a GaAs n-p junction formed from a p-GaAs and an n-GaAs layer, said p-GaAs layer formed on said front surface of said p-germanium substrate, and (2) an n-(Al,Ga)As window layer, said n-(Al,Ga)As window layer formed on said n-GaAs layer;
   (d) a tunnel diode comprising a GaAs n+-p+ junction formed from an n+-GaAs layer and a p+-GaAs layer, said n+-GaAs layer formed on said n-(Al,Ga)As contact layer;
   (e) a second semiconductor cell comprising (1) a (Ga,In)P n-p junction formed from a p-(Ga,In)P layer and an n-(Ga,In)P layer, said p-(Ga,In)P layer formed on said p+-GaAs layer of said tunnel diode and said n-(Ga,In)P layer formed on said p-(Ga,In)P layer, (2) an n-(Al,In)P layer formed on said n-(Ga,In)P layer, (3) metal grid lines contacting said n-(Al,In)P layer, and (4) at least one anti-reflection coating layer covering said n-(Al,In)P layer.

12. The solar cell of claim 11 wherein said at least one anti-reflection coating comprises a first layer of a titanium oxide formed on said n-(Al,In)P layer and a second layer of an aluminum oxide formed on said titanium oxide layer.

13. The solar cell of claim 12 wherein said titanium oxide is represented by the formula $TiO_x$, where x ranges from about 1 to 2 and wherein said aluminum oxide is represented by the formula $Al_2O_y$, where y ranges from about 2 to 3.

14. The solar cell of claim 12 wherein said titanium oxide layer ranges from about 0.04 to 0.06 μm in thickness and wherein said aluminum oxide layer ranges from about 0.05 to 0.09 μm in thickness.

15. The solar cell of claim 14 wherein said titanium oxide layer is about 0.05 μm thick and wherein said aluminum oxide layer is about 0.07 μm thick.

16. The solar cell of claim 11 wherein said metal grid lines directly contact said n-(Ga,In)P layer.

17. A high-efficiency two-junction solar cell comprising:

(a) an n-germanium substrate having a front surface and a back surface, said front surface being passivated;

(b) a back-metal contact on said back surface of said germanium substrate;

(c) a first semiconductor cell comprising (1) a GaAs p-n junction formed from an n-GaAs layer and a p-GaAs layer, said n-GaAs layer formed on said front surface of said n-germanium substrate, and (2) a p-(Al,Ga)As window layer, said p-(Al,Ga)As window layer formed on said p-GaAs layer;

(d) a tunnel diode comprising a GaAs $p^+$-$n^+$ junction formed from a $p^+$-GaAs layer and an $n^+$-GaAs layer, said $p^+$-GaAs layer formed on said p-(Al,Ga)As contact layer;

(e) a second semiconductor cell comprising (1) a (Ga,In)P p-n junction formed from an n-(Ga,In)P layer and a p-(Ga,In)P layer, said n-(Ga,In)P layer formed on said $n^+$-GaAs layer of said tunnel diode and said p-(Ga,In)P layer formed on said n-(Ga,In)P layer, (2) a p-(Al,In)P layer formed on said p-(Ga,In)P layer, (3) metal grid lines contacting said p-(Al,In)P layer, and (4) at least one anti-reflection coating layer covering said p-(Al,In)P layer.

18. The solar cell of claim 17 wherein said at least one anti-reflection coating comprises a first layer of a titanium oxide formed on said p-(Al,In)P layer and a second layer of an aluminum oxide formed on said titanium oxide layer.

19. The solar cell of claim 18 wherein said titanium oxide is represented by the formula $TiO_x$, where x ranges from about 1 to 2 and wherein said aluminum oxide is represented by the formula $Al_2O_y$, where y ranges from about 2 to 3.

20. The solar cell of claim 18 wherein said titanium oxide layer ranges from about 0.04 to 0.06 μm in thickness and wherein said aluminum oxide layer ranges from about 0.05 to 0.09 μm in thickness.

21. The solar cell of claim 20 wherein said titanium oxide layer is about 0.05 μm thick and wherein said aluminum oxide layer is about 0.07 μm thick.

22. The solar cell of claim 17 wherein said metal grid lines additionally contact said p-(Ga,In)P layer.

* * * * *